(12) United States Patent
Chung et al.

(10) Patent No.: US 8,641,157 B2
(45) Date of Patent: Feb. 4, 2014

(54) SLIDE HINGE AND REMOTE CONTROL WITH A SLIDE HINGE

(75) Inventors: Chia-Ko Chung, Shulin (TW); Cheng-Syue Wu, Shulin (TW)

(73) Assignee: Shin Zu Shing Co., Ltd, Taipei Hsien (TW)

( * ) Notice: Subject to any disclaimer, the term of this patent is extended or adjusted under 35 U.S.C. 154(b) by 1239 days.

(21) Appl. No.: 12/458,442

(22) Filed: Jul. 13, 2009

(65) Prior Publication Data

US 2011/0006924 A1 Jan. 13, 2011

(51) Int. Cl.
*A47B 95/00* (2006.01)
*H04M 1/00* (2006.01)

(52) U.S. Cl.
USPC ........................................ 312/333; 455/575.4

(58) Field of Classification Search
USPC .................... 312/334.1, 333, 334.44–334.47; 384/37; 455/575.1, 575.4, 90; 341/20
See application file for complete search history.

(56) References Cited

U.S. PATENT DOCUMENTS

| | | | | |
|---|---|---|---|---|
| 5,335,274 A * | 8/1994 | Masuda et al. | ........... | 379/433.12 |
| 7,084,345 B1 * | 8/2006 | Chen et al. | ..................... | 174/545 |
| 7,158,818 B2 * | 1/2007 | Lee | ............................. | 455/575.4 |
| 7,162,283 B2 * | 1/2007 | Bae et al. | .................... | 455/575.4 |
| 7,184,806 B2 * | 2/2007 | Bae | ............................ | 455/575.4 |
| 7,257,432 B2 * | 8/2007 | Nan | ........................... | 455/575.4 |
| 7,630,744 B2 * | 12/2009 | Lee | ............................. | 455/575.4 |
| 8,108,018 B2 * | 1/2012 | Jung | ........................... | 455/575.4 |
| 8,121,660 B2 * | 2/2012 | Park et al. | ................... | 455/575.4 |
| 2005/0095995 A1 * | 5/2005 | Bae | ............................. | 455/90.3 |
| 2005/0250563 A1 * | 11/2005 | Nan | ........................... | 455/575.4 |
| 2009/0149230 A1 * | 6/2009 | Ruan | ........................... | 455/575.4 |
| 2009/0156275 A1 * | 6/2009 | Park et al. | .................. | 455/575.4 |
| 2009/0298563 A1 * | 12/2009 | Jung et al. | .................. | 455/575.4 |
| 2010/0085721 A1 * | 4/2010 | Dong et al. | .................... | 361/807 |
| 2010/0184491 A1 * | 7/2010 | Jung | ............................ | 455/575.4 |

* cited by examiner

*Primary Examiner* — Darnell Jayne
*Assistant Examiner* — Timothy M Ayres
(74) *Attorney, Agent, or Firm* — Alan Kamrath; Kamrath IP Lawfirm, P.A.

(57) ABSTRACT

A slide hinge is mounted between a body and a cover of a remote control and has a base and a slide pin assembly. The base has two opposite rails and each rail has a rail slot being curved and defined through the rail. The slide pin has a slide pin, a spring and a guide. The slide pin is mounted slidably through the rail slots and capable of moving along a curved path. The spring is mounted around the slide pin. The guide is slidably mounted around the slide pin and selectively compresses the spring. The slide hinge allows the cover to move along a curved path relative to the body.

8 Claims, 10 Drawing Sheets

US 8,641,157 B2

SLIDE HINGE AND REMOTE CONTROL WITH A SLIDE HINGE

BACKGROUND OF THE INVENTION

1. Field of the Invention

The present invention relates to a slide hinge, and more particularly to a slide hinge that is mounted between a body and a cover of a remote control for non-linear relative motion between the body and cover.

2. Description of Related Art

Slide electronic devices have a slide hinge mounted between a body and a cover of the slide electronic devices to allow the cover to slide linearly relative to the body.

With reference to FIG. 10, a conventional slide hinge may be mounted in an electronic device and has a base (1), a slide bracket (2) and a resilient element (3). The base (1) has two rail slots (1A) defined respectively in two opposite sides thereof. The slide bracket (2) has two wings (2A) formed respectively on two opposite sides thereof and slidably mounted respectively in the rail slots (1A). The resilient element (3) has two ends that one end is mounted in a through hole (1B) of the base (1) and the other end is mounted in a mounting hole (2B) of the slide bracket (2).

Therefore, the resilient force of the resilient element (3) speeds up the linear motion of the slide bracket (2) towards two ends of the base (1) when the slide bracket (2) slides on the base (1).

However, when a hand held electronic device has a cover moving relative a body along a cure path, i.e. non-linear motion, the aforementioned slide hinge mounted therebetween disadvantages the curved slide motion. The curved path, especially having a high curvature, decreases the resilient force of the resilient element so that the motion of the cover (2) towards the ends of the base (1) is not speeded efficiently. Therefore, the aforementioned slide hinge cannot be applied to any hand held electronic devices with a non-linear sliding path.

To overcome the shortcomings, the present invention provides a slide hinge to mitigate or obviate the aforementioned problems.

SUMMARY OF THE INVENTION

The main objective of the invention is to provide a slide hinge that is mounted between a body and a cover of a remote control for non-linear relative motion between the body and cover.

A slide hinge in accordance with the present invention is mounted between a body and a cover of a remote control and has a base and a slide pin assembly. The base has two opposite rails and each rail has a rail slot being curved and defined through the rail. The slide pin has a slide pin, a spring and a guide. The slide pin is mounted slidably through the rail slots and capable of moving along a curved path. The spring is mounted around the slide pin. The guide is slidably mounted around the slide pin and selectively compresses the spring. The slide hinge allows the cover to move along a curved path relative to the body.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
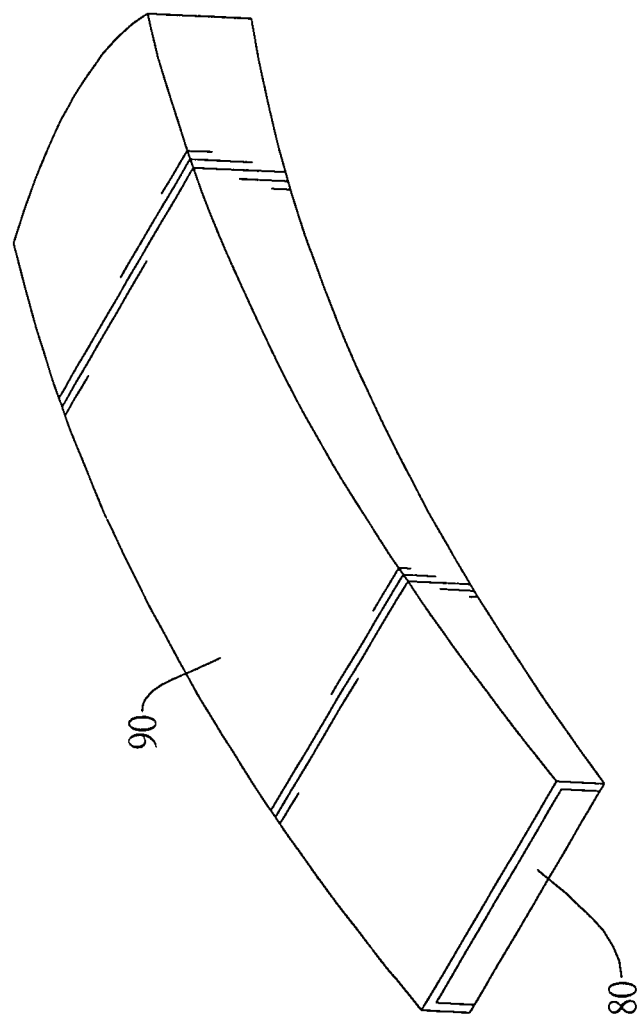
FIG. 1 is a perspective view of a remote control with a slide hinge in accordance with the present invention.
Figure 2:
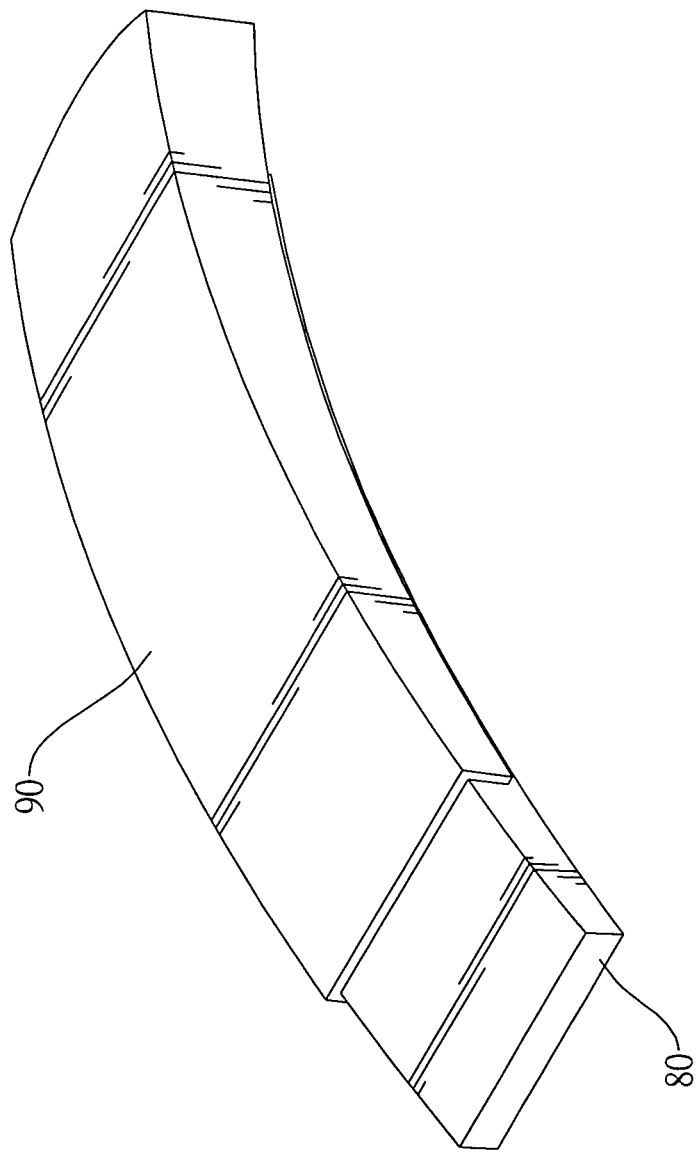
FIG. 2 is an operational perspective view of the remote control in FIG. 1 showing a cover sliding on a body.
Figure 3:
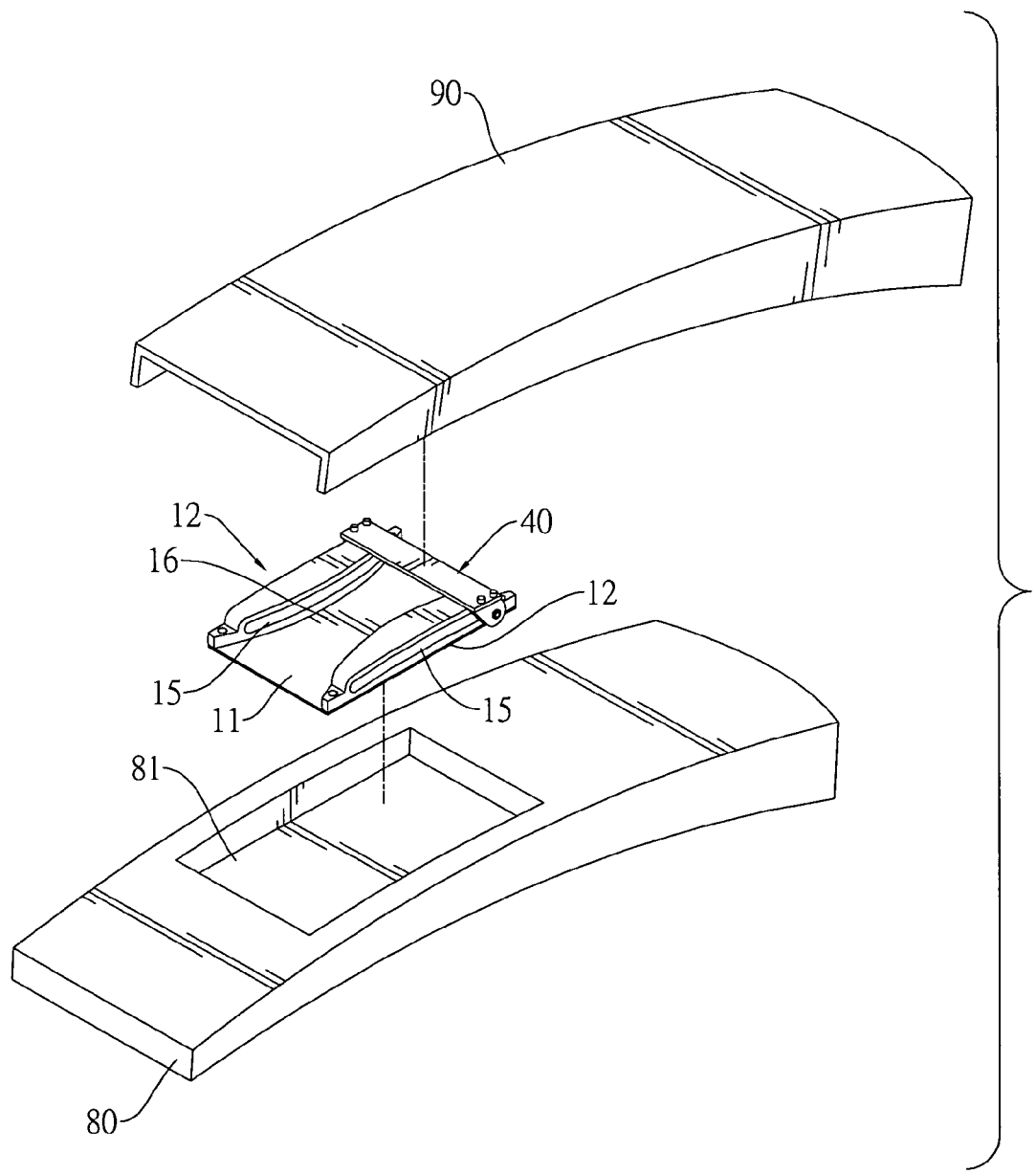
FIG. 3 is a partially exploded perspective view of the slide hinge and remote control in FIG. 2.

With reference to FIGS. 1 to 3, a slide hinge in accordance with the preset invention is mounted in a remote control in accordance with the present invention. The remote control in accordance with the present invention has a body (80) and a cover (90). The body (80) has a top, multiple keys and a mounting recess (81) defined formed on the top.

Figure 4:
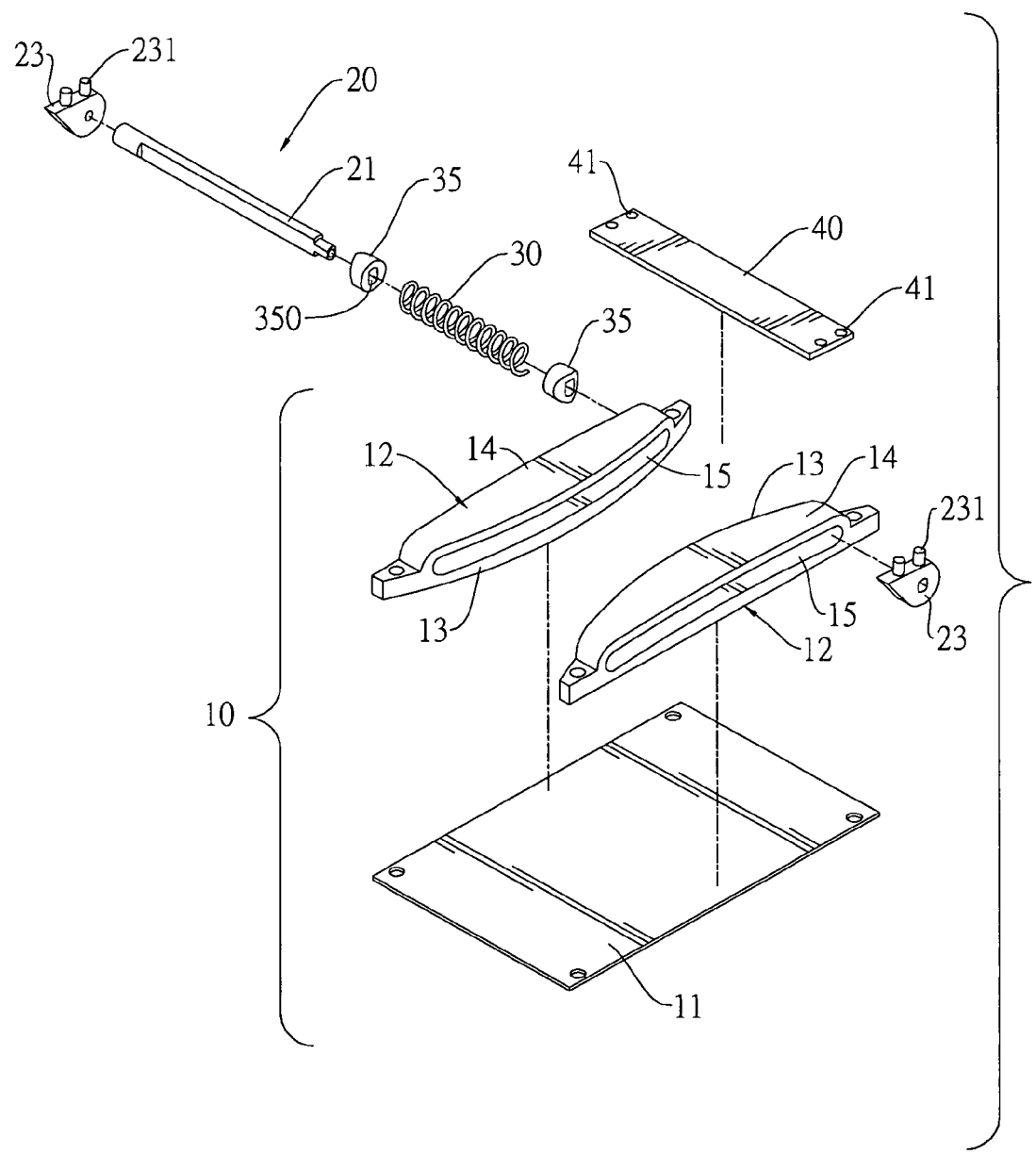
FIG. 4 is an exploded perspective view of the slide hinge in FIG. 3.
Figure 5:
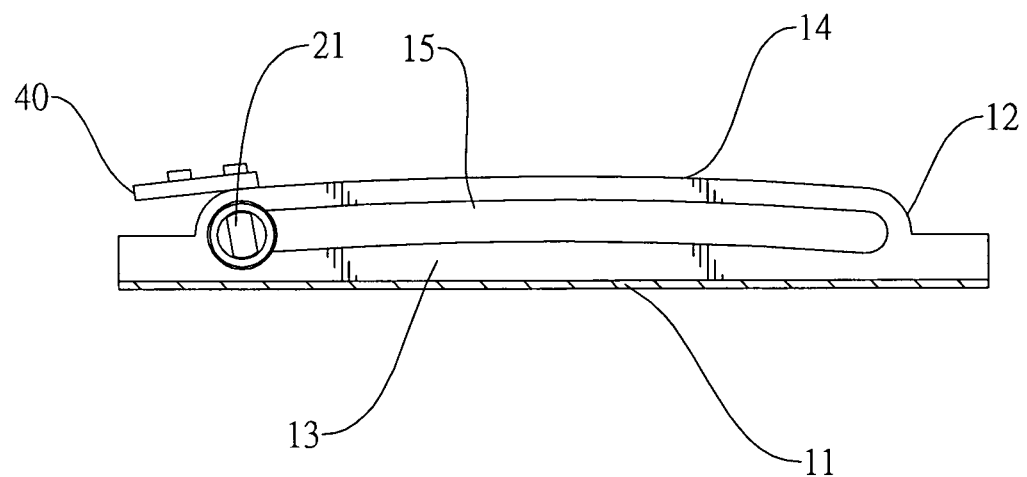
FIG. 5 is a side view of the slide hinge in FIG. 3.
Figure 6:
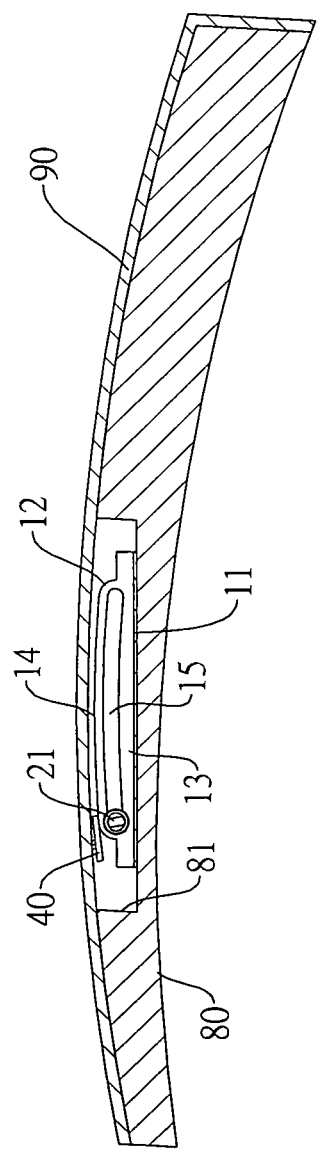
FIG. 6 is a side view in partial section of the remote control with the slide hinge in FIG. 3.
Figure 7:
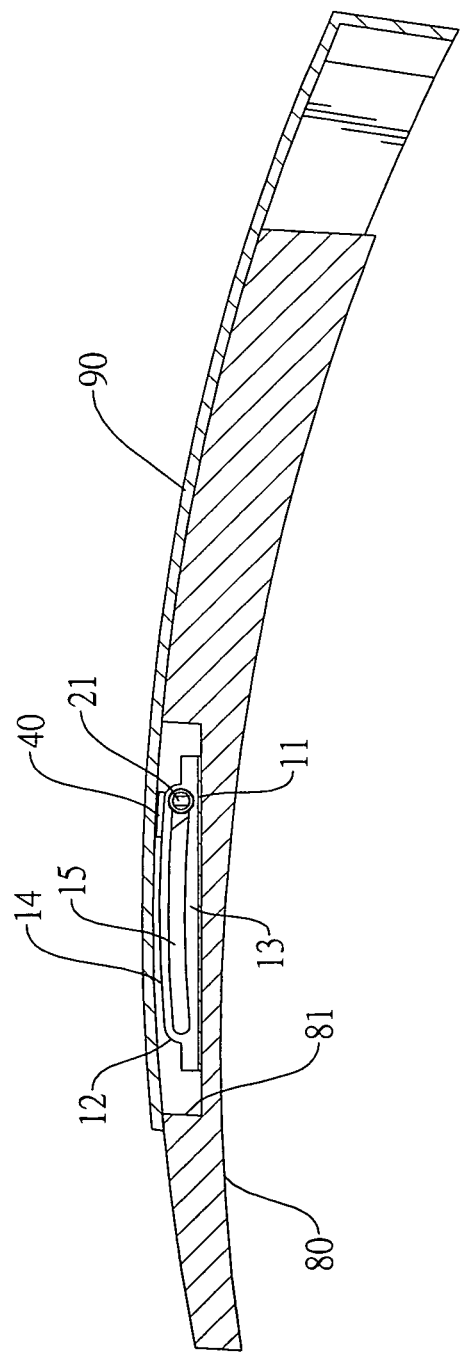
FIG. 7 is an operational side view in partial section of the remote control with the slide hinge in FIG. 6 showing that the cover is opened.
Figure 8:
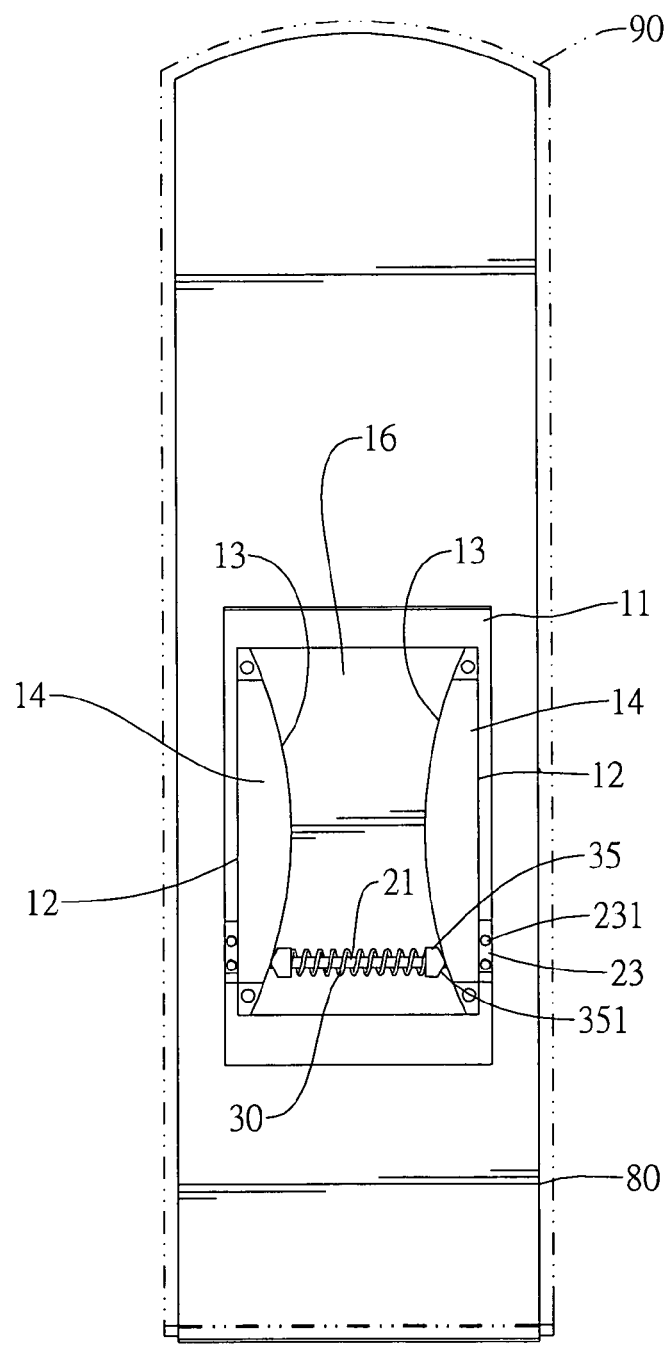
FIG. 8 is a top view of the remote control with the slide hinge in FIG. 6.
Figure 9:
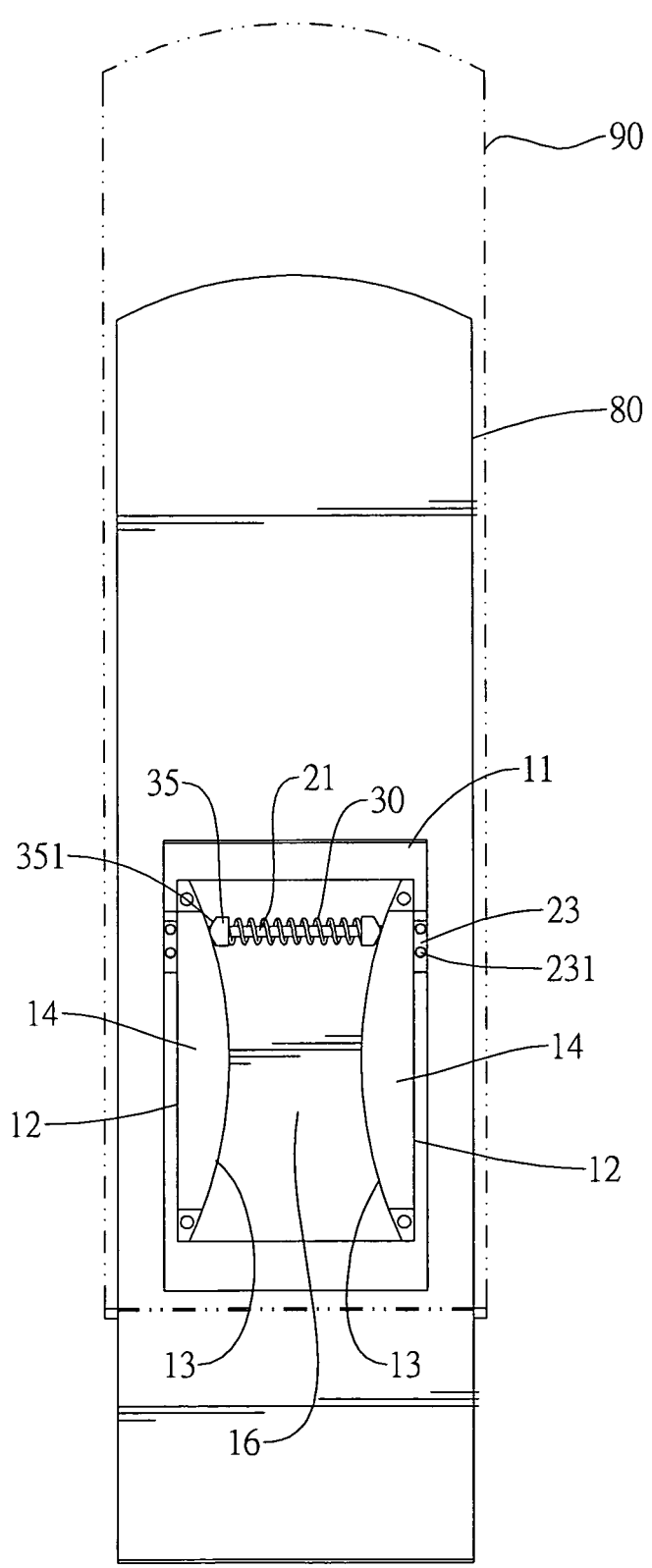
FIG. 9 is an operational view of the remote control with the slide hinge in FIG. 7.
Figure 10:
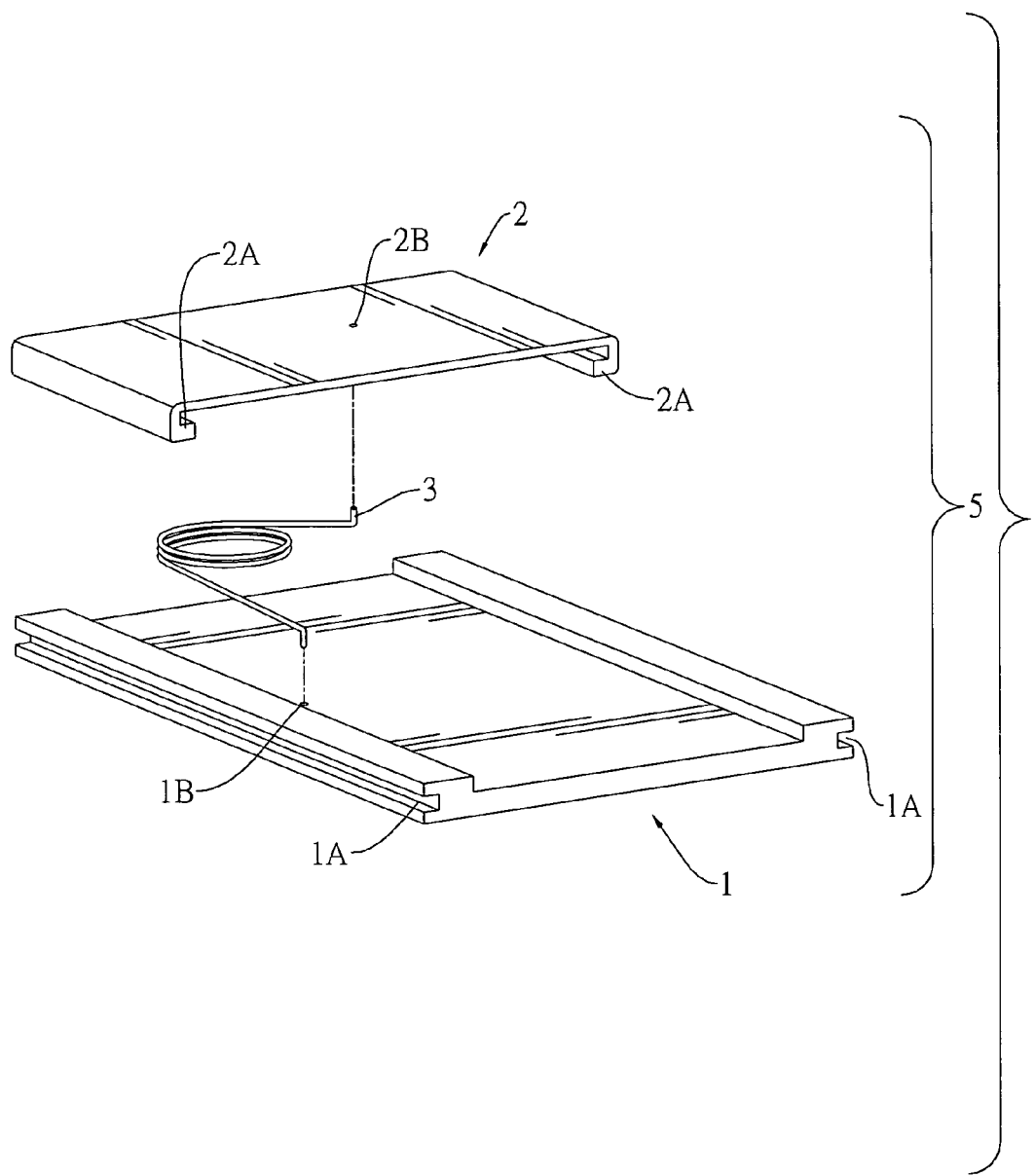
FIG. 10 is an exploded perspective view of a conventional slide hinge in accordance with the prior art.

With further reference to FIGS. 4 and 5, the slide hinge in accordance with the present invention is mounted in the mounting recess (81) of the body (80) and comprises a base (10), a slide pin assembly (20), a spring (30) and a slide bracket (40).

With further reference to FIGS. 6 to 9, the base (10) has a mount (11) and two rails (12). The mount (11) may be board-like, is mounted in the mounting recess (81) of the body (80) of the remote control. The rails (12) are mounted on the mount (12) opposite to each other and each rail (12) has a rail slot (15) being curved and defined transversely through the rail (12). Furthermore, a top surface (14) of each rail (12) may be convex, concave or other curved configurations. A curvature of the top surface (14) of each rail (12) is similar to a curvature of the rail slot (15) of each rail (12). Furthermore, the rails (12) are arranged at an interval (16). Each rail (12) has an inside surface (13) facing the other rail (12) and being a convex surface to make an intermediate of the interval (16) narrower than two ends of the interval (16).

The slide pin assembly (20) is mounted on the base (10) and has a slide pin (21) and two fasteners (23).

The slide pin (21) is formed integrally into one-piece, has a non-circular cross section, is mounted through the rail slots (15) of the rails (12) and selectively slides along the rail slots (15) to implement curve motion.

The fasteners (23) are securely mounted respectively on two ends of the slide pin (21), are respectively outside the rails (12) and each fastener (23) has multiple fastening elements (231) formed on the fastener (23). The fastening elements (231) may be rivets.

The spring (30) is mounted around on the slide pin (21), is located in the interval (16) between the rails (12) and has two ends pressing respectively against the inside surfaces (13) of the rails (12) to bias the slide pin (21) to spontaneously move towards one end of the interval (16) instead of staying on the intermediate. Therefore, the cover (90) connected to the slide pin (16) may be opened or closed completely relative to the body (80). In a preferred embodiment, two guides (35) respectively abut and compress the ends of the spring (30).

Each guide (35) is mounted slidably and non-rotatably around the slide pin (21), is located between the convex surface of one rail (12) and one end of the spring (30) and has a mounting hole (350) defined through the guide (35) and having a non-circular cross section corresponding to that of the slide pin (21). Each guide (35) may be sharp and have two inclined surfaces selectively abutting the convex surface of one rail (12). Thus, when the slide pin (21) is not located at the intermediate of the interval (16), one inclined surface of each guide (35) inevitably abuts the convex surface of one rail (12). The inclined surfaces of each guide (35) smoothly contact the convex surface to reduce friction between the guide (35) and rail (12) and prevent the slide pin (21) from being jammed during the slide motion.

The slide bracket (40) is mounted securely on the slide pin (21) to move in a curve path with the slide pin (21) and is connected securely to the cover (90). In a preferred embodiment, the slide bracket (40) has two ends securely mounted respectively on the fasteners (23). Each end of the slide bracket (40) has multiple fastening holes (41) engaged respectively with the fastening elements (231) of one fastener (23).

The curved rail slots (15) of the rails (12) allow the slide pin (21) and slide bracket (40) to move along a curved path relative to the base (10). Therefore, the cover (90) operates with a curve motion relative to the base (10).

Furthermore, the cover (90) forced by an external force to slide for a distance relative to the body (80) may automatically slide for another distance so that the cover (90) is capable of semi-automatically opening or closing.

Even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A slide hinge comprising:
   a base having a mount and two rails mounted on the mount opposite to each other and each rail having a rail slot being curved and defined transversely through the rail, and at least one of the rail further having a convex surface formed on the rail;
   a slide pin assembly having
      a slide pin mounted slidably through the rail slots and capable of moving along a curved path;
      a spring mounted around the slide pin; and
      at least one guide and each guide mounted slidably around one of two ends of the slide pin and selectively compressing one of two ends of the spring, wherein the guide moves along the convex surface to store or release resilient force of the spring when the slide pin moves along the rail slots.

2. The slide hinge as claimed in claim 1, wherein
   each rail has a convex surface facing the other rail so that an intermediate of an interval between the rails is narrower than two ends of the interval; and
   two guides are mounted slidably around the slide pin and move respectively along the convex surfaces and each guide selectively compresses one end of the spring.

3. The slide hinge as claimed in claim 2, wherein each guide is sharp and has two inclined surfaces selectively abutting the convex surface of one rail.

4. The slide hinge as claimed in claim 2, wherein
   two fasteners are securely mounted respectively the ends of the slide pin and each fastener has multiple fastening elements; and
   a slide bracket is mounted securely on the fasteners through the fastening elements.

5. A remote control comprising a body, a cover and a slide hinge mounted between the body and the cover to allow the cover to move in a curved path relative to the body, and the slide hinge comprising
   a base having a mount and two rails mounted on the mount opposite to each other and each rail having a rail slot being curved and defined transversely through the rail, and at least one of the rail further having a convex surface formed on the rail;
   a slide pin assembly having
      a slide pin mounted slidably through the rail slots and capable of moving along a curved path;
      a spring mounted around the slide pin; and
      at least one guide and each guide mounted slidably around one of two ends of the slide pin and selectively compressing one of two ends of the spring, wherein the guide moves along the convex surface to store or release resilient force of the spring when the slide pin moves along the rail slots.

6. The slide hinge as claimed in claim 5, wherein
   each rail has a convex surface facing the other rail so that an intermediate of an interval between the rails is narrower than two ends of the interval; and
   two guides are mounted slidably around the slide pin and move respectively along the convex surfaces and each guide selectively compresses one end of the spring.

7. The slide hinge as claimed in claim 6, wherein each guide is sharp and has two inclined surfaces selectively abutting the convex surface of one rail.

8. The slide hinge as claimed in claim 5, wherein
   two fasteners are securely mounted respectively the ends of the slide pin and each fastener has multiple fastening elements; and
   a slide bracket is mounted securely on the fasteners through the fastening elements.

* * * * *